United States Patent [19]

Uhling et al.

[11] Patent Number: 5,586,114

[45] Date of Patent: Dec. 17, 1996

[54] MULTIPLEXING INSTRUMENTATION PREAMPLIFIER

[75] Inventors: Thomas F. Uhling, Monument; Eddie A. Evel, Colorado Springs, both of Colo.

[73] Assignee: Hewlett-Packard Company, Palo Alto, Calif.

[21] Appl. No.: 379,416

[22] Filed: Jan. 27, 1995

[51] Int. Cl.$^6$ .............................. H04Q 1/54; H03F 3/68
[52] U.S. Cl. ................... 370/357; 330/124 R; 330/147; 330/148; 370/56
[58] Field of Search .................... 370/112, 53, 56, 370/7, 13, 58.1, 65.5; 330/51, 124 R, 295, 147, 148

[56] References Cited

U.S. PATENT DOCUMENTS

| 4,313,033 | 1/1982 | Walker et al. | 179/1 |
| 4,345,251 | 8/1982 | Begeman | 340/825.86 |
| 4,716,585 | 12/1987 | Tompkins et al. | 379/202 |
| 4,905,238 | 2/1990 | Rinaldis | 370/112 |
| 5,367,520 | 11/1994 | Cordell | 370/60 |
| 5,375,604 | 12/1994 | Kelly et al. | 128/167 |
| 5,420,534 | 5/1995 | Elabd | 327/404 |

*Primary Examiner*—Douglas W. Olms
*Assistant Examiner*—Matthew C. Phillips

[57] ABSTRACT

An oscilloscope preamplifier includes N inputs and Z outputs. A programmable cross-point multiplexer provides a first operating mode in which each of N inputs is connected to a different output thereby providing a preamplifier with Z channels, a second operating mode in which one input is multiplexed to all the outputs which are interleaved to maximize the sampling rate, and a range of operating modes in between. The programmable multiplexer includes a switching amplifier connected between each input and each output. Dials on the preamp select the mode by causing a microprocessor to program latches which activate or deactivate the switching amplifiers. A voltage divider is connected across inputs of the multiplexer to provide a programmable attenuator with selectable attenuation levels.

20 Claims, 6 Drawing Sheets

MULTIPLEXING INSTRUMENTATION PREAMPLIFIER

BACKGROUND OF THE INVENTION

1. Field of the Invention

The invention in general relates to preamplifiers for oscilloscopes or other electronic instrumentation devices, and more particularly to such a preamplifier that includes a cross point multiplexer.

2. Description of the Related Art

In this disclosure "instrumentation" means the area of the electronic art in which analog signals are transmitted with high signal integrity over a wide band-width. An oscilloscope is an example of such an instrumentation device. Oscilloscopes and other instrumentation devices often include a preamplifier, usually referred to as a preamp. Since oscilloscopes and other instrumentation devices must be capable of distinguishing small nuances of signals of a wide spectrum of frequencies, such preamps must also be capable of amplification with high signal integrity over a wide band width.

State-of-the-art oscilloscopes employ analog to digital signal acquisition systems, thus new generation oscilloscopes include analog to digital converters. The requirement of high signal integrity, and the inherent limitations of analog to digital converter technology, limits the sample rate that can be achieved in such analog to digital converters. The limitation on sample rate necessarily implies a limitation on band width.

To overcome the band-width limitation, oscilloscope preamps have been developed that include multiple outputs each of which can be connected to a analog to digital (A/D) converter. The outputs of the A/D converters are then interleaved to produce a high sample rate.

Present-day electronic circuits are becoming more and more complex, with ever-increasing numbers of circuit nodes, such as pins, to be tested. Thus, another direction that the art of oscilloscope preamp has taken is to provide several channels in the preamp, each channel carrying a different signal.

Current oscilloscope preamps make trade-offs between available channel count and sample rate. However, the needs of a user may change, or vary from project to project. Thus, an oscilloscope preamp purchased with an eye toward high channel count may come up short if a project calls for high sample rate, and vice-versa.

Oscilloscope amplifiers also generally include variable attenuators in the front end. These typically are mechanical switches that are manually set on the front of the preamp. Since each channel must have such an attenuator, this requirement of an attenuator puts significant constraints on how many channels can be included in a reasonably sized preamp, and also adds significantly to the cost of a many-channel preamp.

SUMMARY OF THE INVENTION

The present invention solves the above problems by providing an instrumentation preamp that can be programmed: to pass a signal from a single input to many outputs, thereby permitting the interleaving of outputs to provide a high sample rate; or to pass signals from many inputs to the same number of outputs, thereby providing a multichannel preamp having a high channel count; or to pass signals from an intermediate number of inputs to an intermediate number of outputs, thereby providing a function anywhere in between the prior two functions.

The invention provides an instrumentation preamp including multiple inputs and multiple outputs and a programmable cross-point multiplexing amplifier. The cross-point multiplexing amplifier can be programmed to connect any of the inputs with any of the outputs. The multiplexing amplifier includes two portions: a switching portion and a feedback portion. A switching portion is provided for each input and for each output. The feedback portion is common for each output. This design allows a high density of multiplexing switches while still providing high signal integrity and wide band width.

The multiplexing amplifier is implemented on a custom integrated circuit chip. Each amplifier switching portion includes an emitter pair connected to a current source. The current source can be activated or deactivated by a programmable latch thereby connecting or disconnecting the input associated with the amplifier switching portion to the output associated with the amplifier switching portion.

The cross-point multiplexing amplifier also makes possible a simple solution to the attenuation problem. The mechanical attenuators of the prior art are replaced by a voltage divider network with each different attenuation level of the divider being connected to a different input of the multiplexer. Then, simply by activating the amplifier switching portion associated with the input having the desired attenuation level, the desired attenuation may be selected. Thus, the combination of a voltage divider network and the programmable cross-point multiplexer provides an electronically programmable attenuator.

Preferably the voltage divider network comprises resistors in series with the appropriate amplifier input and the corresponding multiplexer inputs, with increasing resistances between the amplifier input and each successive multiplexer input, thus providing increasing levels of attenuation with each input.

The invention provides an instrumentation preamplifier system comprising: a plurality of inputs; a plurality of outputs; interleaving means for providing an increased sample rate signal by interleaving signals on at least some of the plurality of outputs, with at least a plurality of the outputs electrically connectable to the interleaving means and at least a plurality of the outputs are electrically connectable to an instrumentation device; and programmable means for connecting any of the inputs with any one or more of the outputs with no two inputs connected to the same output, whereby the instrumentation preamplifier may be programmed to provide either a preamplifier with as many channels as the lesser of the number of the inputs or the number of the outputs, or a preamplifier with a lesser number of channels with a higher sampling rate. Preferably, each of the outputs comprises a preamplifier output and includes an analog signal output and a trigger output, and the system further includes an analog to digital converter connected between each of the analog signal outputs and the interleaving means and also providing an output connectable to an instrumentation device. Preferably, the amplifier system includes selection means for selecting the inputs and outputs; and the programmable means comprises cross-point multiplexing means, responsive to the selection means, for electrically connecting the selected inputs to the selected outputs. Preferably, the cross-point multiplexing means comprises an amplifier including: an input transistor emitter and an output transistor emitter, the input transistor emitter and the first output transistor emitter connected together to form an emitter pair; a current source; and switch means responsive to the selection means for connecting the current source to the emitter pair. Preferably, the switch means comprises a transistor and a latch connected to base of the transistor, the latch being part of a serial shift register, the selection means comprises a computer, and the instrumentation device comprises an oscilloscope. Preferably, the instrumentation preamplifier system also includes gain selection means for selecting one of a plurality of possible gains for signals passing from the inputs to the outputs, and multiple gain means, responsive to the gain selection means, for providing the selected gain to the signals. Preferably, the system includes attenuation selection means for selecting one of a plurality of attenuations for signals passing from the inputs to the outputs and multiple attenuation means, responsive to the signals from the attenuation selection means, for providing the selected attenuation to the signals. Preferably, the multiple attenuation means comprises the programmable means, the programmable means is responsive to the attenuation selection means for electrically connecting the selected input to the output, and includes multiplexer inputs, and the multiple attenuation means also includes a voltage divider network connected to a plurality of the multiplexer inputs.

In another aspect, the invention provides an oscilloscope preamplifier comprising: a plurality of preamplifier inputs and a plurality of preamplifier outputs; interleaving means for interleaving signals on at least some of the outputs; and programmable cross-point multiplexing means for connecting the inputs to the outputs to provide a first operating mode in which each of at least a plurality of the amplifier inputs is connected to a different single corresponding output thereby providing a preamplifier with multiple channels, and a second operating mode in which one input is multiplexed to at least a plurality of the interleaved outputs to provide a system with an increased sample rate. Preferably, the programmable cross point multiplexing means comprises means for providing a range of operating modes between a maximum channel count mode in which each of the amplifier inputs is connected to a different single corresponding output and a maximum sample rate mode in which one input is connected to all of the outputs. Preferably, the programmable cross-point multiplexing means comprises a plurality of amplifiers, each of the amplifiers connected between one of the plurality of inputs and one of the plurality of outputs. Preferably, the oscilloscope preamplifier further includes selection means for selecting one or more of the amplifiers, and the programmable cross-point multiplexing means further comprises a current source, and switch means, responsive to the selection means, for connecting the selected amplifiers to the current source. Preferably, the cross-point multiplexing means comprises: a plurality of amplifier switching portions, each including a switch means for activating and deactivating the amplifier switching portion; a plurality of amplifier feedback portions; and wherein there are N×Z of the amplifier switching portions and Z of the amplifier feedback portions, where N is the number of the inputs and Z is the number of the outputs, and wherein there is a different one of the amplifier switching portions connected between each of the inputs and each of the outputs; and each of the amplifier feedback portions is common to a plurality of amplifier switching portions and is connected to its corresponding output.

In a further aspect, the invention provides an instrumentation preamplifier system comprising: an input and an output; attenuation selection means for selecting one of a plurality of attenuations for analog signals passing from the input to the output and providing electrical data signals representative of the selected attenuation; and multiple attenuation means, responsive to the electrical data signals, for providing the selected attenuation to the analog signals. Preferably, the multiple attenuation means comprises a multiplexer having multiplexer inputs and a voltage divider connected to a plurality of the multiplexer inputs. Preferably, the input is one of a plurality of inputs, the output is one of a plurality of outputs, the attenuation selection means includes means for selecting one or more of the plurality of inputs and one or more of the plurality of outputs, and the multiple attenuation means comprises: cross-point multiplexing means, responsive to the attenuation selection means, for electrically connecting the selected inputs to the selected outputs, the multiplexing means including multiplexer inputs; and a voltage divider network connected to a plurality of the multiplexer inputs. Preferably, the voltage divider network comprises a first resistor connected between a first one of the multiplexer inputs and a second one of the multiplexer inputs, and a second resistor connected between the first resistor and a third one of the multiplexer inputs. Preferably, the multiple attenuation means includes a multiple attenuation circuit and a multiple gain means, responsive to the selection means for providing one of a plurality of gains to signals passing through the amplifier, whereby the net attenuation of the amplifier comprises the gain provided by the multiple gain means times the attenuation provided by the multiple attenuation circuit.

The invention not only provides an instrumentation preamplifier that can be programmed into a variety of modes from a very high sample rate mode to a very high channel count mode, but it also, for the first time, provides an interface between such preamplifiers and electronic programmers, such as computers, opening the door to the speed and economies associated with computerization. Numerous other features, objects and advantages of the invention will become apparent from the following description when read in conjunction with the accompanying drawings.

DESCRIPTION OF THE PREFERRED EMBODIMENT

1. Overview

Figure 1:
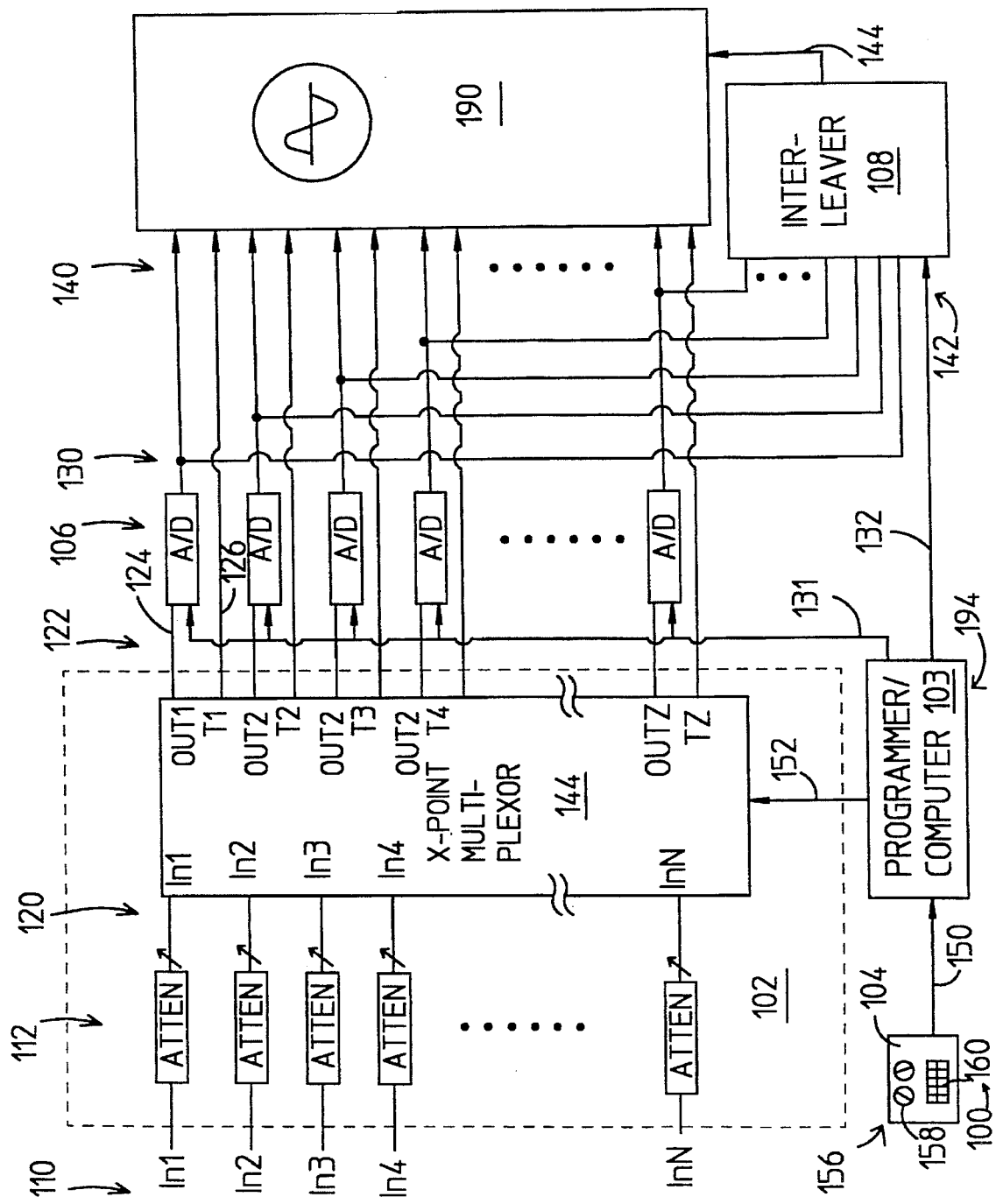
FIG. 1 is a block circuit diagram of the preferred embodiment of an instrumentation preamplifier system according to the invention.

FIG. 1 shows the preferred embodiment of an instrumentation preamplifier system 100 according to the invention. System 100 includes instrumentation preamplifier 102, programmer 103, programming input means 104, analog to digital (A/D) converters 106, and interleaving circuitry 108.

It should be understood that the specific system shown in the figures and described herein, is exemplary. That is, it is intended to show preferred examples of the invention so that those skilled in the art can fully understand and implement it. It is not intended to limit the invention to the specific examples described and shown.

In this disclosure, the term "electrically connected" when applied to two electrical elements, such as an input and an output, means that an electrical signal, such as a voltage, a current, an analog signal, or a digital signal, will pass from one element to the other. This is in distinction to a physical connection by electrical components. For example, an input and an output may be physically connected by wires, amplifiers, transistors, resistors and other electrical components, but no signal will pass from the input to the output because one or more of the switching or amplification components may be off. In this case, the input and output are not "electrically connected". In this disclosure "amplifier" means an electronic circuit that passes signals, usually changing the amplitude, without significant distortion, and includes 1:1 amplifiers as well as negative amplifiers, not just amplifiers with a positive gain.

Returning to FIG. 1, instrumentation amplifier section 102 includes N inputs 110, N variable attenuators 112, a cross-point multiplexer 114, and Z pairs of outputs 122. In the preferred embodiment, it also contains additional parts that are not shown in FIG. 1 for clarity, but will be shown below. Here, N and Z are integers between 2 and any number of nodes of a circuit under test; but practically N is between 2 and about a thousand, and Z is between 2 and about 10. Each pair of outputs 122 includes an analog signal output 124 and a trigger output 126. When we refer to an "output" below, we generally mean an output pair, unless the context indicates otherwise. Each of the N variable attenuators is connected in series between one of the instrumentation amplifier inputs 110 and a corresponding one of the N multiplexer inputs 120. Each analog output 124 of the preamplifier outputs 122 connects to one of Z A/D converters 106. The Z outputs 130 of the A/D converters provide the N non-interleaved outputs 140 of the preamplifier system 100 which are connectable to an oscilloscope 190, or other instrumentation device. Each of the Z outputs 130 of the A/D converters 106 also is connected to the inputs 142 of interleaving means 108. As known in the art, interleaving means 108 interleaves the signals on its inputs 142 to provide an interleaved signal on output 144 to the oscilloscope 190 or other instrumentation device.

Programming input means 104 provides a signal on line 150 to programmer 103, which in turn provides data and clock signals on cable 152 to cross-point multiplexer 114. Programming input means 104 incudes a selection means 156 for selecting which of the inputs 120 of multiplexer 114 are to be connected to which of the outputs 122 of preamplifier 102. In the preferred embodiment, selection means 156 includes dials, such as 158, on the front of the preamp section 102 or a computer terminal keyboard 160, though both are shown in one "input" box for simplicity. Programmer 103 preferably comprises a computer, most preferably a microprocessor, a memory, and software in the memory as well as logic circuitry, none of which is shown in detail, since how to provide data and clock signals using a computer are well-known. As will be seen below, the data and clock signals on cable 152 program latches (FIGS. 4 and 5) in multiplexer 114 to activate and deactivate amplifiers connecting inputs 120 and outputs 122.

In the preferred embodiment, amplifier section 102, programmer 103, A/D converters 106 and interleaver 108 all are located in a main frame of an oscilloscope, and programming input means 104 comprises dials on the front of the oscilloscope main frame, or a work station keyboard. The computer which forms part of programmer 103 also provides clock signals and commands to A/D converters 106 and interleaver 108 on cables 131 and 132, respectively.

Whenever an input is connected to the analog signal output 124 of an output pair 122, it is also connected to the trigger output 126 of the pair. This also applies to system output pairs 140. Thus, it should be understood that, for purposes of the embodiment discussed herein, when we refer to "an output" herein, we are in fact referring to an output pair 122 or 140 unless it is specified otherwise in the context. Also, it is evident that in the embodiment shown, each preamplifier input 110 corresponds to a multiplexer input 120, and each multiplexer output 120 corresponds to a system output 140. Thus the inputs 110 and 120 can usually be used interchangeably in the discussion, and the outputs 122 and 140 can also be used interchangeably. The system 100 permits any of inputs 110 to be connected to any of outputs 140. For example, each different input 120 may be connected to a different one of outputs 122. In this mode, the number of channels is maximized. Generally, N is greater than Z so that not all the inputs can be connected to an output simultaneously, so in the mode in which the number of channels is maximized, each different one of Z of the inputs 120 are connected to a different one of the Z outputs 122. In another mode, one input 120 is connected to all of the outputs 122, and the signals from the A/D converters 106 are interleaved to maximize the sampling rate. Any other mode in between these two modes is also possible. For example, one input 120, such as In1, may be connected to four of outputs 122, such as outputs 1, 2, and 3, while Z-4 of the other inputs 120 are each connected to one of the remaining outputs 122. In such a mode there is one channel having a moderately high sample rate and at the same time a moderately high total channel count for the system as a whole.

An important feature of the invention is that the mode programming is electronic. The cross-point multiplexer also makes it possible to make the attenuation selection electronic. First, a gain selection feature (FIGS. 3 and 5) in the integrated circuit chip (FIGS. 2 and 3) permits the reduction of the number of different attenuation levels if a conventional mechanical attenuator is used. Secondly, the combination of voltage dividers (FIG. 6) with the cross-point multiplexer 114 makes it possible to completely eliminate the mechanical attenuators.

2. Detailed Description of the Preferred Instrumentation Amplifier

Figure 2:
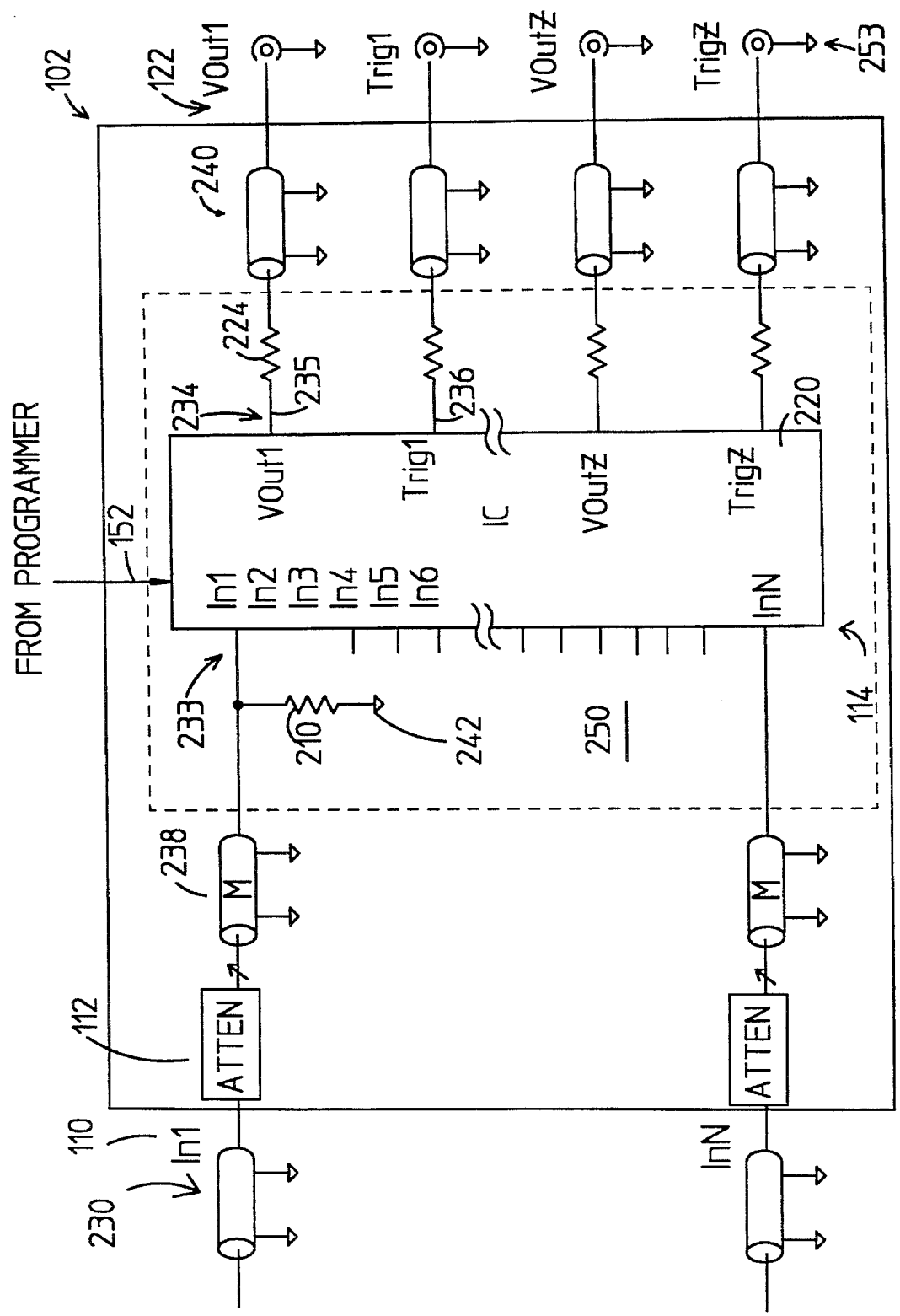
FIG. 2 is partial block circuit diagram of the preamplifier of the system of FIG. 1.

Turning to FIG. 2, there is shown a partially block circuit diagram of an oscilloscope preamplifier 102, which is the preferred embodiment of the instrumentation preamplifier 102 of FIG. 1, and thus the same numerals are used for the same parts. Preamplifier 102 comprises inputs 110, attenuators 112, N resistors such as 210, integrated circuit 220, 2Z resistors 224, and outputs 122. Integrated circuit 220 includes N inputs 233 and Z outputs 234. Multiplexer 114 is contained in IC 220, and will be described in detail below. Generally, 50 ohm coaxial cables 230 connect to each of inputs 110, and attenuators 112 are connected to the inputs 233 of I 220 via 50 ohm microstrips 238. Each input 233 of I chip 220 is connected to ground through a resistor 210. In this disclosure ground is indicated by an inverted triangle as shown at 242. Each output 234 of I 220 is connected to a corresponding output 122 of preamplifier 102 through a resistor 224 and 50 ohm coaxial cable 240. Each output 122 preferably connects to an A/D converter via a coaxial cable 253. Preferably resistors 210 and 224 are 50 ohm resistors. Preferably, each of variable attenuators 112 provides a selection between 1:1 attenuation, 5:1 attenuation, and 10:1 attenuation. To illustrate one embodiment of the invention, the attenuators 112 shown in FIG. 2 are conventional mechanically actuated attenuators. This illustrates that mechanical attenuators may be used in combination with one aspect of the invention, though preferably, the attenuators are electronic as described below in connection with FIG. 6. Preferably, I chip 220 is located on a chip carrier 250 on a circuit board (not shown) in the main frame of the oscilloscope.

Figure 3:
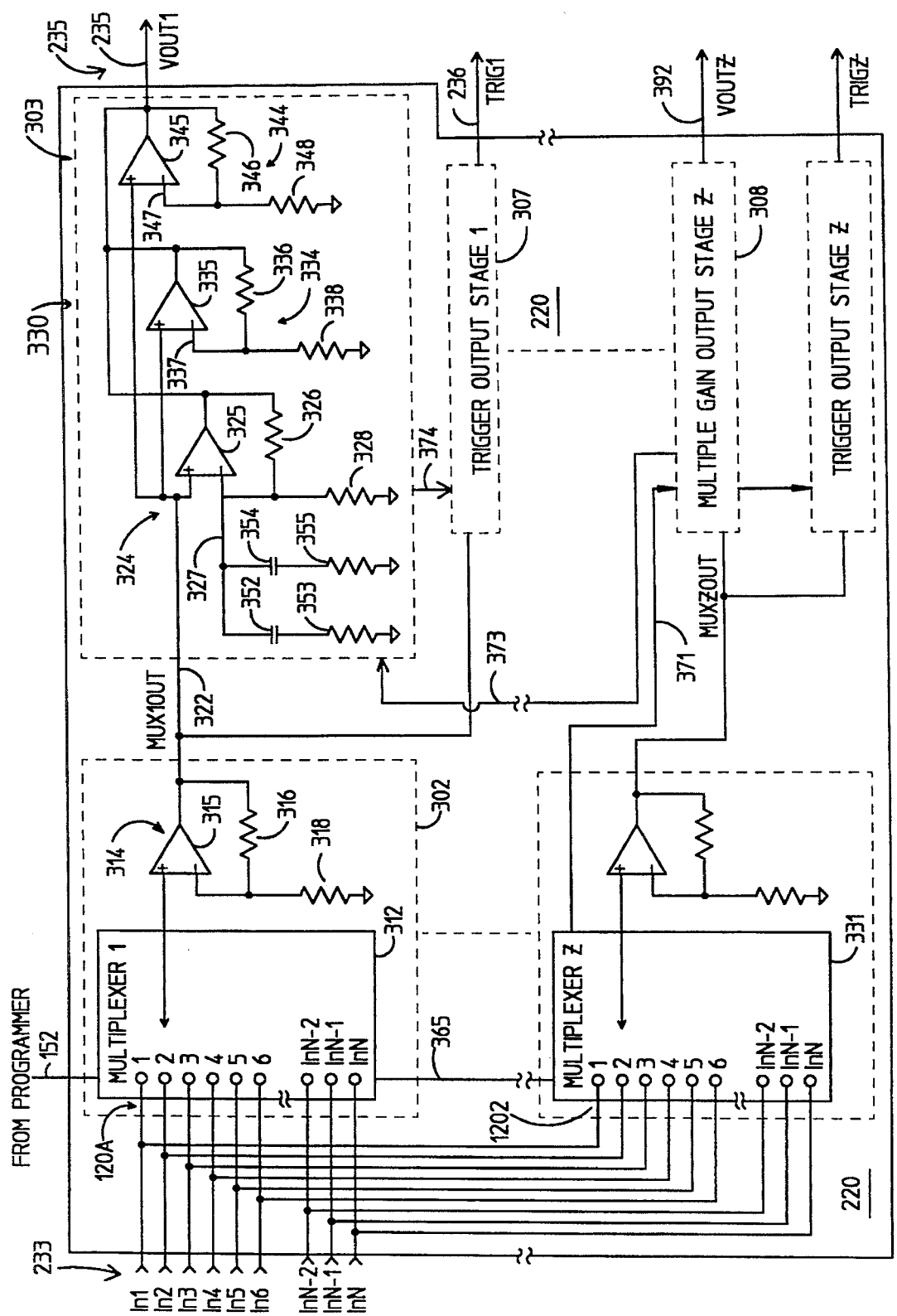
FIG. 3 is a partially block circuit diagram of an integrated circuit chip used in the oscilloscope preamplifier of FIG. 2.

FIG. 3 shows a block circuit diagram of integrated circuit 220. It includes Z stages, only two, 1 and Z, of which are shown, and the 1st stage is shown in more detail. Only the 1st stage will be discussed in detail since the others are essentially identical. The 1st stage includes a multiplexer amplifier (muxamp) 302, a multiple gain output stage 306, and a trigger output stage 307. As will be seen in detail below, trigger output stage 307 is almost identical to multiple gain stage 306, and thus it will not be discussed in detail except as to how it differs from multiple gain stage 306. Muxamp 302 can be considered to include a multiplexer 312 and a feedback amplifier circuit 314, although as will be seen in FIG. 4, this division is not fully accurate, since in the actual circuit the feedback of amplifier 314 passes through a portion of multiplexer 312. The feedback amplifier circuit 314 includes amplifier 315 and a pair of resistors 316 and 318 which form a voltage divider which determines the gain of the amplifier.

Multiple gain output stage 306 can be considered to include three feedback amplifiers 324, 334, and 344, each with a different voltage divider which determines its gain. Feedback amplifier 324 includes programmable amplifier 325 and a voltage divider comprising resistors 326 and 328; feedback amplifier 334 includes programmable amplifier 335 and a voltage divider comprising resistors 336 and 338; and feedback amplifier 344 includes programmable amplifier 345 and a voltage divider comprising resistors 346 and 348. In addition, the multiple gain output stage 306 includes cable compensation circuit 351 comprising capacitors 352 and 354 and resistors 353 and 355. As will be seen below, each of the amplifiers 325, 335, and 345 are programmable in that they can be programmed on or off through the data signal that is carried to the output stage 306 via the lines 152, 365, 371 and 373. The trigger output stage 307 is the same as the multiple gain output stage 306, except it does not include the cable compensation circuit 351, since in the applications in which long cables connected to output stage are used, the trigger output stage is not used; also, as will be seen below, trigger output stage 307 does not include the latches that use the data signal, but instead utilize the signals from latches in the output stage 306 via lines 374.

Integrated circuit 220 includes N inputs 233 and Z outputs 234. As mentioned above, each output 234 includes an analog output 235 and a trigger output 236. Each input 233 is connected to the N inputs 120A of multiplexer 312, to the N inputs 120Z of multiplexer 331, and to the N inputs of all the other multiplexers of the other stages between 1 and Z. The first multiplexer 312 is connected to the data line 152, which provides the data signal from programmer 103. The data signals are passed from multiplexer 312 to the other multiplexers via line 365, and then to the output stage 308 via line 371, then to the other output stages via line 373. As will be discussed below, each multiplexer, such as 312, connects one of its inputs to the positive input of the corresponding feedback amplifier, such as 314, in response to the signals received on cable 152. The output 322 of amplifier 314 is connected to its negative input through resistor 316 and its negative input is also connected to ground through resistor 318. The output 322 of amplifier 314 provides the MUX1OUT signal which is applied to the positive inputs of amplifiers 325, 335 and 345. Each of the outputs of amplifiers 325, 335 and 345 are connected to its negative input through resistors 326, 336 and 346, respectively. Each negative input of amplifiers 325, 335, and 345 is connected to ground through resistors 328, 338, and 348, respectively. The negative input of amplifier 325 is also connected to ground through capacitor 354 and resistor 355 connected in series, and to ground through capacitor 352 and resistor 353 connected in series. The outputs of amplifiers 325, 335, and 345 are connected to the output 235 of I 220 and provide the VOUT1 signal. Trigger output stage Z is connected to the output 322 of amplifier 314 and provides the TRIG1 output signal on output 236. Similarly each of the other Z stages provides a signal VoutZ and TrigZ.

Preferably, resistors 316, 318, 326, 328, 336, 338, 346, 348, 353, and 355 are 100 ohms, 88 ohms, 125 ohms, 105 ohms, 125 ohms, 105 ohms, 90 ohms, 1.1 Kohms, 420 ohms, and 1.5 Kohms, respectively. Preferably, capacitors 352 and 354 are 1 picofarad and 6 picofarads, respectively. These values result in a gain of 2.1 for amplifier 315, a gain of 2.2 for amplifiers 325 and 335, and a gain of 1.1 for amplifier 345. The gains of the amplifiers are slightly larger than the desired net gain for the system 100, e.g. 2.1 rather than 2, to allow for slight losses elsewhere in the system. That is, the selection of a 2.1 gain factor will result in an approximate net gain of 2 for the system 100.

Figure 4:
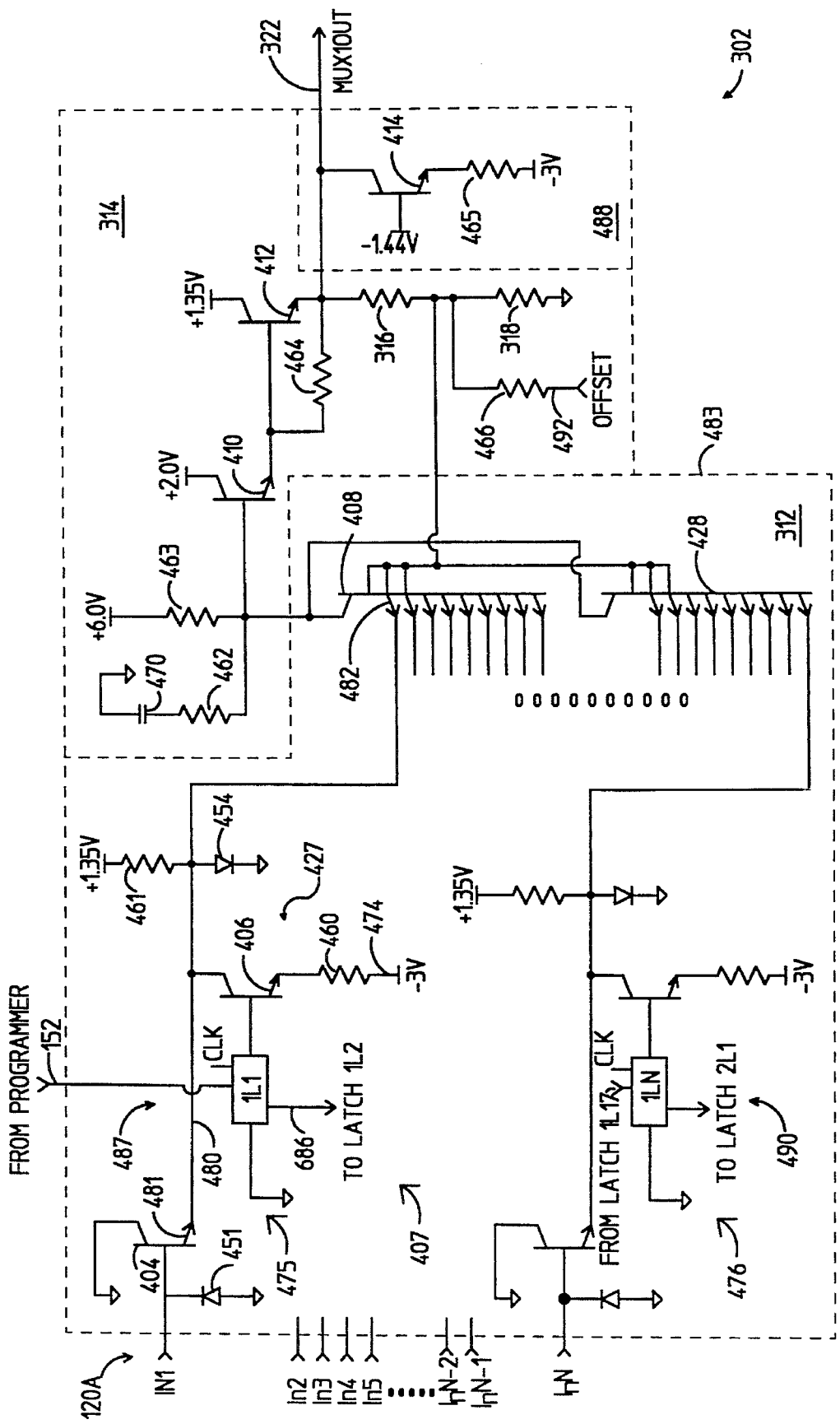
FIG. 4 is a circuit diagram of the multiplexer amplifier in the integrated circuit chip of FIG. 3.

A detailed circuit diagram of the multiplexer amplifier 302 is shown in FIG. 4. Muxamp 302 includes N inputs 120A, transistors 404, 406, 408, 410, 412, 414, and 428, latches 1L1 through 1LN, diodes 451 and 454, resistors 316, 318, and 460 through 466, capacitor 470, output 322, and other unnumbered components, the function of which is clear from the discussion of the numbered components. Preferably, all transistors in this circuit and in other circuits of this disclosure are bipolar NPN transistors. Transistors 408 and 428 are nine emitter transistors. The latches 1L1 and 1LN, and the other latches discussed below, may be any device having an output that may be latched in either of two states: a "low" or logic "0" state that in this embodiment is preferably about −3.0 volts, and a "high" or logic "1" state that in this embodiment is about 0.0 volts. The latches are labeled with designations, such as 1L1 and 1LN, that indicate their relative position in the circuit and in a shift register 490 composed of all the latches in the integrated circuit 220 connected in series. The number before the "L" indicates which stage the latch is in, and the number after the "L" indicates the latch number in the muxamp in that stage. Preferably resistors 460 through 466 have the values 125 ohms, 2 Kohms, 500 ohms, 2.3 Kohms, 1 Kohm, 200 ohms, and 1.8 kohms. Capacitor 470 preferably has a value of 0.2 picofarads.

Muxamp 302 includes N:1 multiplexer 312, which is the circuit to the left of the dotted line 483, a feedback amplifier 314 for driving the signal selected by multiplexer 312 out of the muxamp, and a current source circuit 488 for biasing the output 322. In the implementation shown in FIG. 4, the feedback circuit for amplifier 314 actually passes through transistors 408 and 428 which are part of multiplexer 312. Multiplexer 312 is essentially N programmable amplifiers, such as 487, which can be selectively activated via latches 490. Each programmable amplifier 487 includes a simple amplifier that includes two transistors, such as 404 and 408, with their emitters, such as 481 and 482 connected. We shall refer to this amplifier as an "emitter pair" 480. Each programmable amplifier also includes a current source, such as 474 and a switch means 477. In the implementation shown, transistor 408 is a nine-emitter transistor, so it acts as the second transistor for the first nine of the amplifiers 487, while a second nine-emitter transistor 428 acts as the second transistor for the last nine of the amplifiers. The amplifier circuit, e.g. the circuit shown between input In1 and the first emitter of transistor 408, is repeated N times in muxamp 302, though only the first and last, i.e. the amplifier circuit for inputs In1 and InN, are shown. As will be clear from the following, each of these amplifier circuits together with the three amplifiers 324, 334, and 335 in the multiple gain output stage, such as 306, defines a separate preamplifier channel.

The In1 input is connected to the base of transistor 404 and is also grounded through diode 451, which has its anode connected to ground. In this configuration, diode 451 protects against excessive negative voltages applied to the input In1. Diode 451 begins to turn on when the negative voltage on the input reaches about 0.7 volts. Protection against positive voltage excursions is provided by the collector/base junction of transistor 404, which, as known in the art, is essentially a diode. The collector of transistor 404 is connected to ground.

Note that in this disclosure voltage sources are shown as a line with the voltage written next to it, as at 474. In the preferred embodiment, the main frame power supply (not shown) provides voltages of +6.0 volts, +1.35 volts, and −3.0 volts. Each I chip also has an on-chip circuit that generates −1.44 volts. Other intermediate voltages are obtained in a conventional manner by placing one or more diodes that attenuate the voltage between the line carrying the appropriate voltage from the power supply (not shown) and the portion of the circuit where the intermediate power source is shown.

The separate biasing of each channel, i.e. the separate connection of each channel to the power supply through the collector of the first transistor, such as 404, prevents adjacent channels from "talking" via the power supply. Thus, it provides isolation when the channel is off. As mentioned above, the emitter of transistor 404 is connected to the first emitter of transistor 408. The emitter pair 480 is connected to the collector of transistor 406. The base of transistor 406 is connected to the output of latch 1L1. Line 152 applies the shift register data signal to latch 1L1, which signal is passed to the next latch via line 486. A clock signal is also applied to clock the latch, as is known in the art. Latch 1L1 is also referenced to ground separately from the other latches in the multiplexer to produce an accurate, repeatable bias lever for the control switch comprising latch 1L1 and transistor 406. The emitter of transistor 406 is connected to the −3.0 volt voltage source through resistor 460. When latch 1L1 goes high, it turns transistor 406 on, which provides a current source for the amplifier circuit passing through the first emitter of transistor 408 and comprising transistors 404 and 408, activating this amplifier and thus turning on channel 1 of the first multiplexer 312. This electrically connects the input In1 associated with this channel to the first output 234, i.e. analog output 235 and trigger output 236 of stage 1 of the integrated circuit 220.

Emitter pair 480 is also connected to ground through diode 454, the cathode of which is connected to ground, and is connected to the +1.35 volt voltage supply through resistor 461. The combination of diode 454 tied to ground and the connection to the +1.35 voltage source through resistor 461 forces emitter pair 480 to a controlled shut-off voltage when the channel is not connected, and further assists in reducing coupling between the channels. Preferably the controlled shut-off voltage is about 0.75 volts, which reverse biases the base/emitter junctions of transistors 404 and 408 when latch XA1 is off.

In the just discussed manner, the circuit from each multiplexer input 120A through the corresponding emitter of transistors 408 or 428 together with one of the three gain circuits 324, 334, and 345, defines a preamplifier circuit path from the preamplifier input 110 (FIG. 1 ) that is associated with multiplexer input, to the output 122 of the preamplifier that is associated with the stage, which path is referred to herein as a channel. For example, the circuit from the In4 input 110, through the In4 input of multiplexer 331, through the 4th emitter of the transistor equivalent to transistor 408 in the Zth stage, through the gain amplifier equivalent to gain amplifier 324 in the Zth stage, through the output 392 (FIG. 3), to the Zth output 122 of the preamplifier, defines a unique path through the preamplifier, which path is referred to as channel 4 of the Zth stage of preamplifier 102.

Returning to the discussion of FIG. 4, the circuit 475 between input InN and the last emitter of transistor 428 is identical in structure and function as the circuit 476 between IN1 and the first emitter of transistor 408, except that the latch 1LN is in a different position in the shift register 490 of latches, and thus its function will be determined by the data bit in that position. Each of these circuits comprise an emitter pair amplifier, such as 480, a current source, such as 474, and a switch means 477 comprising a transistor, such as 406, and a latch, such as 1L1. The switch means 477 connects the current source 474 to the amplifier 487 to activate the amplifier when a logic "1" is shifted into latch 1L1 via data line 152 and the latch goes high to activate transistor 406.

Referring to FIGS. 3 and 4 and analyzing the cross-point multiplexer 114 in another way, the basic multiplexing amplifier 407 includes two portions: a switching portion, such as 475, and a feedback portion 314. As can be seen from FIGS. 3 and 4, a switching portion, such as 475 or 476, is provided for each input 233 and for each output 234. That is, if N is number of inputs 233 and Z is the number of outputs 234, then the number of switching portions, such as 475, is equal to N times Z. There is a different switching portion connected between each input and each output. This is fundamentally the reason why any one of the inputs can be connected to any one of the outputs, and the programming for this can be easily accomplished. On the other hand, feedback portion 314 is common to all the switching portions that connect to each output. This permits the feedback portion to be relatively sophisticated without unduly multiplying the complexity of the circuit. This design allows a high density of multiplexing switches while still providing high signal integrity and wide band width.

The collectors of transistors 408 and 428 are connected to the base of transistor 410, to a +6.0 volt power source through resistor 463, and to ground through resistor 462 and capacitor 470 connected in series. The collector of transistor 410 is connected to a +2.0 volt power source, and its emitter is connected to the base of transistor 412 and the muxamp output 322 through resistor 464. The collector of transistor 412 is connected to the +1.35 power source and its emitter is connected to output 322. The output 322 is also connected to the bases of transistors 408 and 428 through resistor 316 to provide the feedback discussed in connection with FIG. 3. The bases of transistors 408 and 428 are also connected to ground through resistor 378 and to the offset voltage input 492 through resistor 466. The offset voltage is applied from a calibration control module (not shown) and provides a means for trimming the muxamp 302 circuit for calibration purposes.

Output 322 also is connected to the collector of transistor 414. The base of transistor 414 is connected to a −1.44 volt power source and its emitter is connected to the −3.0 volt power source through resistor 465. This circuit 488 provides a bias for transistors 410 and 412 at a value that permits that transistors to operate as desired.

Figure 5:
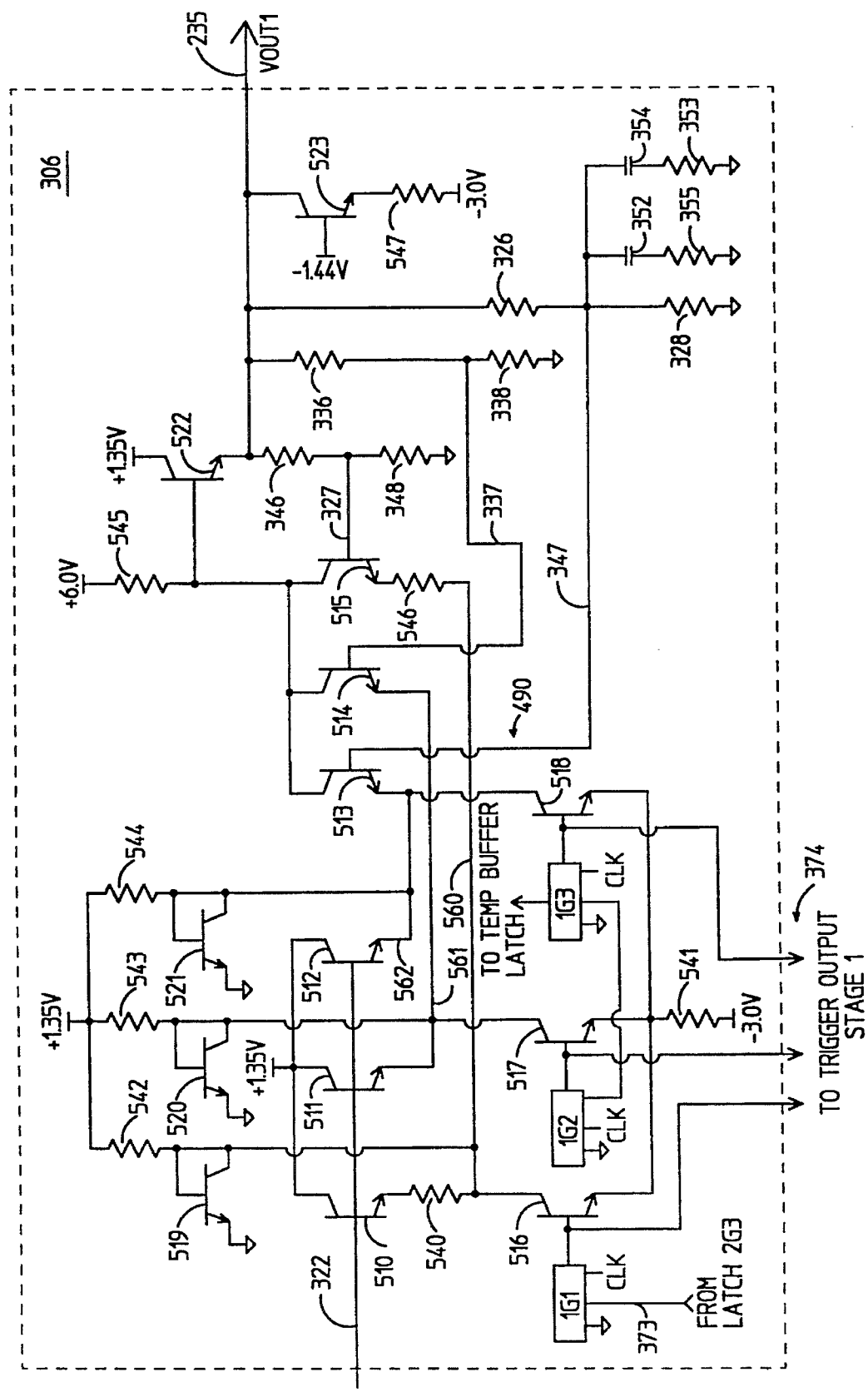
FIG. 5 is a circuit diagram of the multiple gain output stage in the integrated circuit chip of FIG. 3.

The detailed circuit for multiple gain output stage 306 is shown in FIG. 5. This circuit comprises a multiple gain means 303 (FIG. 3), responsive to the signals on data line 152 from gain selection means 156 (FIG. 1), for providing selected gain to signals passing from inputs 230 (FIG. 2) to outputs 122. Output stage 306 includes transistors 510–523, latches 1G1–1G3, resistors 326, 328, 336, 338, 346, 348, 353, 355, and 540–547, and capacitors 352 and 354. The number before the "G" in the latch number again refers to the stage of the preamplifier 102, the "G" refers to the fact that it is a multiple gain output stage latch, and the last number refers to the number of latch in the multiple gain stage. Preferably, resistors 540–547 have the values 20 ohms, 135 ohms, 2 Kohms, 2 Kohms, 2 Kohms, 2.7 Kohms, 20 ohms, and 100 ohms, respectively. The values for the other components were given above.

The bases of transistors 510, 511, and 512 are connected to the output stage input 322, while their collectors are connected to the +1.35 volts power source. The emitter of transistor 510 is connected to the emitter of transistor 515 through resistors 540 and 546 in series. The node 560 between the resistors is connected to the collector of transistor 516. The emitter of transistor 511 is connected to the emitter of transistor 514 and to the collector of transistor 517. The emitter of transistor 512 is connected to the emitter of transistor 513 and to the collector of transistor 518. Each of the collectors of transistors 513, 514, and 515 are connected to the +6.0 volts power source through resistor 545 and to the base of output transistor 522. The emitters of transistors 516–518 are connected to the minus 3.0 volts power source through resistor 541. The outputs of latches 1G1, 1G2, and 1G3 are connected to the bases of transistors 516, 517, and 518, respectively, and also are connected to the base of the corresponding transistor in the corresponding trigger output stage via lines 374. Thus, whenever a channel is selected in the multiple gain output stage 306, the corresponding channel is selected in the trigger output stage 307, and the same for each of the other stages 2 through Z. Each latch is serially connected along the shift register data line 373, which comes most immediately from the 2G3 latch and ultimately from the programmer 103 (FIG. 1), and, after passing through latches 1G1, 1G2, and 1G3, goes to the latch of the temperature buffer circuit (not shown) in the integrated circuit chip. As discussed above, each latch also has a clock input, and is separately grounded. Similarly to the circuits associated with the latches in FIG. 4, each latch/transistor, such as 1G2/517, provides a current source for the associated differential amplifier, such as that comprising transistors 511 and 513, which current source can be turned on and off by the latch to control which of the amplifiers 325, 335, or 345 (FIG. 3) that the signal input on line 322 passes through.

Each node 560, 561, and 562 between the emitter pairs of the three differential amplifiers is connected to the +1.35 volt power source through a resistor, such as 543, and is connected to the collector and base of a transistor, such as 520, which has its emitter connected to ground, in which configuration the transistor, such as 520, acts as a diode. This circuit insures that the base/emitter junction of transistors, such as 511 and 514, is reverse biased when the corresponding latch, such as 1G2, is off, so that these transistors remain off. In addition, this arrangement causes the diodes, such as 520, to turn on when the latch, such as 1G2, is off, and connects the node to ground, which prevents any signal from coupling through the amplifier, such as 334.

The collector of transistor 522 is connected to a +1.35 volt power supply and its emitter is connected to output 235. The nodes 347, 337, and 327 connected to each of the bases of transistors 513, 514, and 515, respectively, are the nodes connected to the negative input of amplifiers 345, 335, and 325 (FIG. 3), respectively. The connection of the voltage divider resistors 326, 328, 336, 338, 346, and 348 to these nodes was shown in FIG. 3 and discussed with respect to that figure.

The collector of transistor 523 is connected to the output node 235, and its emitter is connected to the −3.0 volt power source through resistor 547. Its base is connected to a −1.44 volt power source. This circuit provides biasing for output transistor 522.

From the above, it can be seen that the multiple gain output stage 506 comprises three programmable amplifiers 524, 525, and 526, which share an output transistor 522. For example, programmable amplifier 535 comprises transistors 511, 514, and 517, latch 1G2, resistors 541 and 543, and diode 520, together with output transistor 522. The feedback that makes this amplifier 335 a feedback amplifier 334 is provided through resistor 336 and node 337, and the voltage division that determines the gain of amplifier 334 is provided by resistors 336 and 338. The amplifier 335 is programmed by the data applied to the shift register that includes latch 1G2. If latch 1G2 holds a logic "0" the latch and programmable amplifier 335 is programmed to be OFF and if latch 1G2 holds a logic "1" the latch and programmable amplifier 335 are programmed to be ON. Similarly the latch 1G1 determines whether amplifier 325 is on or off, and latch 1G3 determines whether amplifier 345 is on or off.

A feature of the invention is that the multiple gain portion 330 of the preamplifier 102 makes it possible to provide the same number of attenuation levels for the preamplifier 102 as a whole with a lesser number of attenuation levels in attenuators 112. For example, while we mentioned that a 5:1 attenuation factor is available from attenuators 112, this may be obtained without a 5:1 attenuator level specifically available in attenuator 112 by combining the 10:1 attenuation level in attenuators 112 with the 2.1:1 gain factor in multiple gain portion 330 of preamplifier 102.

Referring to FIG. 1, the preamplifier system 100 is programmed as follows. The inputs 110 to be connected to the outputs 122, and the outputs 122 to which each of the selected inputs 110 is to be connected are selected by turning dials, such as 158 on the front of preamplifier 102 or by inputting the information with a work station keyboard 160. Input means 104 responds by providing electrical signals to channel selection programmer 103, which utilizes an internal microprocessor and memory (not shown) to output serial data on cable 152 to shift a series of data bits through all the latches, such as 1L1, 1L2, through ZLN in the multiplexers 312–331 in integrated circuit 220 (FIGS. 3 and 4) and the latches 1G1 through ZG3 in multiple gain output circuits 306–308 in integrated circuit 220. As indicated above the latches, as a whole, essentially form a shift register 490, and, like conventional shift registers, the data shifts from one latch to the next with each clock pulse. In the preferred embodiment, the order of the latches in the shift register 490 is: latches 1-N in the 1st stage multiplexer 312, i.e. the latches 1L1 through 1LN in FIG. 4, then latches 1-N in the 2nd stage multiplexer (not shown), then on through the N latches in each successive stage through the Zth stage, then the three latches, ZG1, ZG2, and ZG3, in the Zth stage multiple gain output stage 308, then the three latches in the Z-1 stage, and so on through the latches 1G1, 1G2, and 1G3 (FIG. 5) in the 1st stage multiple gain output stage 306, then the temperature buffer latch (not shown). This order is essentially determined for the convenience of the I fabrication process, and any other order is possible. The string of bits output by programmer 103 in response to the parameters input with input means 104 activates or deactivates the latches as appropriate to connect the selected input or inputs with the selected output or outputs, with the desired gain.

At this point the instrumentation preamplifier system 100 has electrically connected either: one of the inputs 110 (FIG. 1) to one, some, or all of the outputs 122, each of some of the inputs 110 to one or some of outputs 122, or each of Z inputs 110 to one output 122. At the same time the gain for each output 122 has been set by activating one of the amplifier circuits in each multiple output stage 306–308 corresponding to each output 122 (FIG. 2) that has been selected. Of course, since each of the outputs 122 connect to a system output 140 through an A/D converter 106, the above is also true if the system outputs 140 are substituted for the preamplifier outputs 122 in the above discussion. Nothing more needs to be done to pass a signal from the selected input(s) 110, to the selected output(s) 122, 140 with the desired gain over a wide band width and with high signal integrity.

Figure 6:
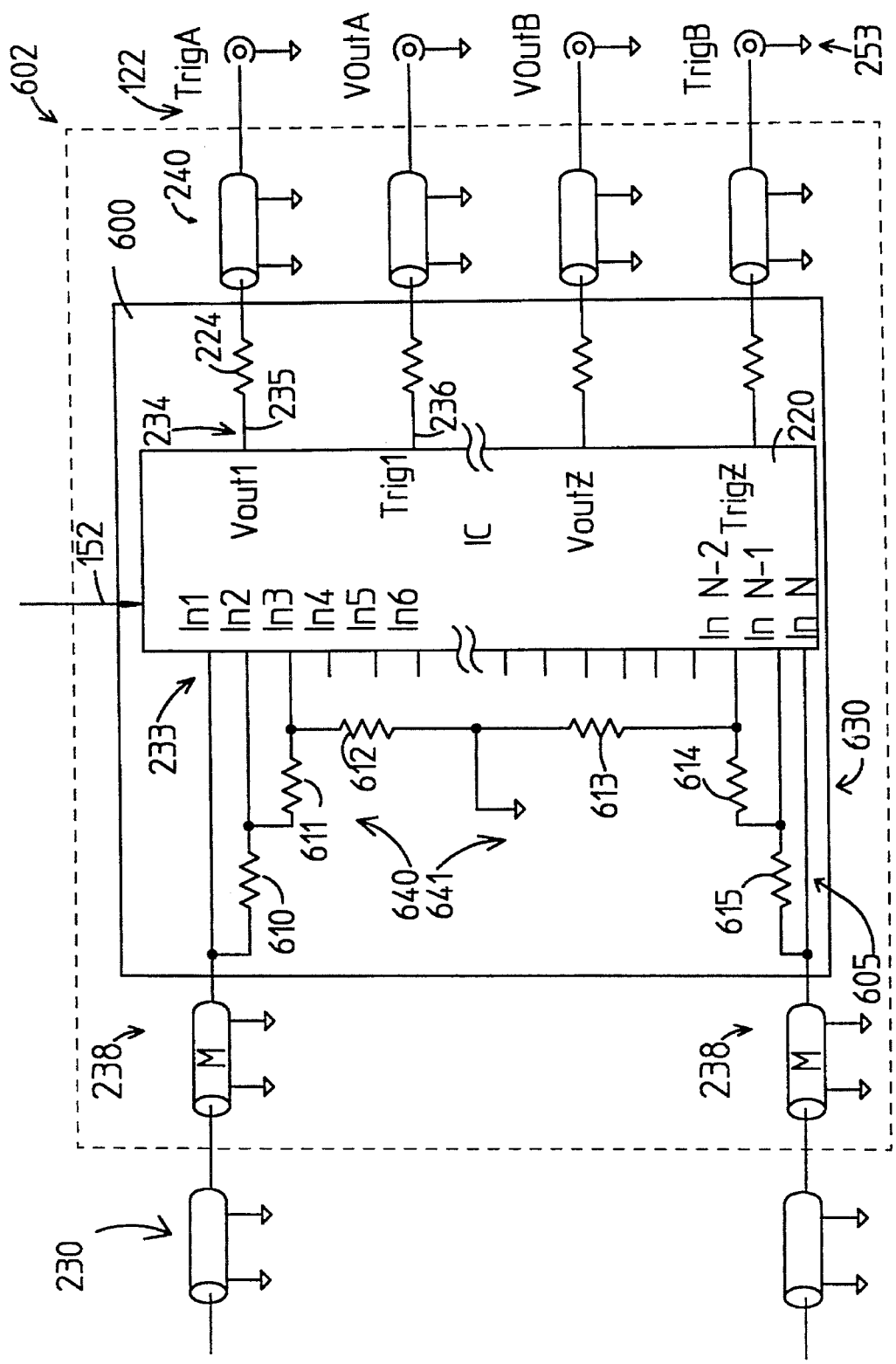
FIG. 6 is a partially block circuit diagram of an oscilloscope preamplifier including an electronically programmable attenuator.

FIG. 6 shows an embodiment of the programmable instrumentation amplifier according to the invention in combination with a voltage divider to provide a programmable attenuation circuit 600. This embodiment is similar to the embodiment of FIG. 2, and to permit ease of comparison, the elements that are the same as the embodiment of FIG. 2 are numbered the same. Again this embodiment is preferably in an oscilloscope preamp 602 and includes an integrated circuit chip 220 which is identical to the integrated circuit chip described in FIGS. 3–5. In this embodiment, attenuators 112 of FIG. 2 are replaced by three-level voltage dividers 640 and 641 to form a multiple attenuation means 605, responsive to the signals on data line 152 from attenuation selection means 156 and programmer 103, for providing selected attenuation to signals passing from inputs 230 to outputs 122. Voltage divider 640 includes resistors 610, 611, and 612, while voltage divider 641 includes resistors 613, 614 and 615. As in the embodiment of FIG. 2, the first of preamplifier inputs 230 is connected to the In1 input of I inputs 233. However, the equivalent of the second and third preamplifier inputs (not shown) in FIG. 2 are either missing or not used. Instead, resistor 610 is connected between input In1 and input In2 of I inputs 233, resistor 611 is connected between input In2 and In3 of I inputs 233, and resistor 612 is connected between input In3 and ground. Likewise a microstrip 238 connects the Nth preamp input with the inN input of I chip 220, and the N-2 and N-1 preamplifier inputs are either missing or not used. Resistor 615 is connected between I inputs InN and InN-1, resistor 614 is connected between I inputs InN-1 and InN-2, and resistor 613 is connected between I input InN-2 and ground. As before, I chip 220 is connected to programmer 103 via data cable 152.

As we have seen several times now, I chip 220 can connect any one of its inputs to one, some, or all of its outputs. Resistors 610 through 612 form a first channel voltage divider 640 and resistors 613 through 615 form a Zth channel voltage divider. Depending on which of I inputs In1, In2, In3, InN-2, InN-1, or InN are selected to be connected to the outputs 234, and which outputs 234 are selected, the signal input on the I input In1 or InN will be passed to the selected output with a different attenuation. For proper termination of coaxial cables 230 and microstrips 238, the total of the resistances in each attenuator 640 and 641 should be 50 ohms. Preferably resistors 610 through 615 have the values 25 ohms, 15, ohms, 10 ohms, 10 ohms, 15 ohms, and 25 ohms, respectively. This results in an attenuation of one if inputs In1 or InN are selected, two if inputs In2 or InN-1 are selected, and five if inputs In3 or InN are selected. Thus, the combination of voltage divider circuits 640 and 641 with multiplexer amplifiers according to the invention in I 220, results in a programmable attenuation circuit 600 that, for a wide band width of frequencies, passes signals input on cables 230 to one, some, or all of outputs 234 with little distortion and the selected attenuation.

The preamplifier 602 is programmed in a manner identical to the manner in which preamplifier 102 is programmed, except that the data input into the latches associated with the In1, In2, In3 InN-2, InN-1, and InN inputs of I inputs 233 selects the input which will provide the desired attenuation. Moreover, the gains provided by means of the multiple gain output stages associated with the selected outputs may be combined with the attenuations selected so that in the case of preamplifier 602 a wider variety of net gain for the system are programmable than is possible with just the gains available in the output stages 306–308. For example, a 10:1 attenuation factor in the attenuation portion 630 of amplifier 602 may be combined with a 2.1:1 gain provided in the multiple gain output stage portion 330 to provide a net attenuation of approximately 5:1 for the preamplifier 602 as a whole. It also should be understood that much more than just three different attenuation levels may be provided. Since the integrated circuit 220 can have hundreds or even thousands of inputs 233, voltage dividers 640 and 641 can have hundreds or even thousands of different attenuation levels. If the attenuation difference between each level is small, the attenuation means 605 can act as an attenuation vernier.

The invention has been disclosed with respect to a single cross-point multiplexer having Z output stages and N input channels in each stage. The invention also contemplates that several cross-point multiplexers may be connected in series, with several first level multiplexers, each multiplexing a number of inputs to a number of outputs, and a second level multiplexer multiplexing the outputs of the first level multiplexer to a lesser or greater number of outputs. See for example, copending U.S. patent application Ser. No. (PDN 1094751). The invention has also been disclosed in terms of a system 100 in which each A/D converter output 130 connects both directly to instrumentation device 190 and to interleaver 108. The invention also contemplates that some A/D converter outputs may connect only to instrumentation device 190 and some A/D converter outputs may connect only to interleaver 108. This embodiment permits the number of direct channels and the number of interleaved channels to be programmed by programming means 194 (FIG. 1) comprising selection means 156, programmer 103, cable 152, shift register 490 and the two emitter amplifiers such as 489.

A more detailed explanation of portions of the circuits shown in FIGS. 1 through 6 may be obtained from copending U.S. patent applications Ser. Nos. (PDNs 1094750 and 1094751) which are hereby incorporated by reference.

There has been described a novel instrumentation preamplifier which provides programmable selection of multiple modes from high sampling rate modes to high channel count modes, provides high signal integrity and band width, and which has many other advantages. It is evident that, now that the invention has been fully disclosed, those skilled in the art may now make numerous uses and modifications of the specific embodiment described, without departing from the inventive concepts. For example, now that it is seen that an analog signal preamplifier can be made in which any one of hundreds of modes can be selected using a keyboard or dial and at the same time can still provide the high band width and signal integrity required for such preamplifiers, others can now utilize the teachings of how to do this to design and manufacture many different varieties of analog preamplifiers. Some specific examples of other embodiments have been mentioned above. In addition, equivalent components or circuits can be substituted for the various components and circuits described. Additional features may be added. A greater or lesser number of parts may be used. Consequently, the invention is to be construed as embracing each and every novel feature and novel combination of features present in and/or possessed by the instrumentation preamplifier described.

What is claimed is:

1. An instrumentation preamplifier system comprising:
  a plurality of instrumentation preamplifier inputs;
  a plurality of instrumentation preamplifier outputs;
  interleaving means for providing an increased sample rate signal by interleaving signals on at least some of said plurality of instrumentation preamplifier outputs, with at least a plurality of said instrumentation preamplifier outputs electrically connectable to said interleaving means and at least a plurality of said instrumentation preamplifier outputs are electrically connectable to an instrumentation device; and
  programmable means for connecting any of said instrumentation preamplifier inputs with any one or more of said instrumentation preamplifier outputs with no two inputs connected to the same output, whereby said instrumentation preamplifier may be programmed to provide either a preamplifier with as many channels as the lesser of the number of said inputs or the number of said outputs, or a preamplifier with a lesser number of channels with a higher sampling rate.

2. An instrumentation preamplifier system as in claim 1 wherein each of said outputs includes an analog signal output and a trigger output, and said system further includes an analog to digital convertor connected between each of said analog signal outputs and said interleaving means and also providing an output connectable to an instrumentation device.

3. An instrumentation preamplifier system as in claim 1 and further including selection means for selecting said inputs and outputs, and wherein said programmable means comprises cross-point multiplexing means, responsive to said selection means, for electrically connecting said selected inputs to said selected outputs.

4. An instrumentation preamplifier system as in claim 3 wherein said cross-point multiplexing means comprises an amplifier including:
  an input transistor emitter and an output transistor emitter, said input transistor emitter and said first output transistor emitter connected together to form an emitter pair;
  a current source; and
  switch means responsive to said selection means for connecting said current source to said emitter pair.

5. An instrumentation amplifier system as in claim 4 wherein said switch means comprises a transistor and a latch connected to base of said transistor, said latch being part of a serial shift register.

6. An instrumentation preamplifier system as in claim 5 wherein said selection means comprises a computer.

7. An instrumentation preamplifier system as in claim 1 and further including gain selection means for selecting one of a plurality of possible gains for signals passing from said inputs to said outputs, and wherein said programmable means includes multiple gain means, responsive to said gain selection means, for providing said selected gain to said signals.

8. An instrumentation preamplifier system as in claim 1 and further including attenuation selection means for selecting one of a plurality of attenuations for signals passing from said inputs to said outputs, and multiple attenuation means, responsive to said signals from said attenuation selection means, for providing said selected attenuation to said signals.

9. An instrumentation preamplifier system as in claim 8 wherein said multiple attenuation means includes said programmable means and said programmable means is responsive to said attenuation selection means, for electrically connecting said selected input to said output, said programmable means including multiplexer inputs; and said attenuation means further includes a voltage divider network connected to a plurality of said multiplexer inputs.

10. An instrumentation preamplifier system as in claim 1 wherein said instrumentation device comprises an oscilloscope.

11. An instrumentation amplifier as in claim 1 wherein said plurality of attenuation circuits comprise a first resistor connected between a first one of said multiplexer inputs and a second one of said multiplexer inputs, and a second resistor connected between said first resistor and a third one of said multiplexer inputs.

12. An oscilloscope preamplifier comprising:
  a plurality of oscilloscope preamplifier inputs and a plurality of oscilloscope preamplifier outputs;
  interleaving means for interleaving signals on at least some of said oscilloscope preamplifier outputs; and
  programmable cross-point multiplexing means for connecting said oscilloscope preamplifier inputs to said oscilloscope preamplifier outputs to provide a first operating mode in which each of at least a plurality of said oscilloscope preamplifier inputs is connected to a different single corresponding oscilloscope preamplifier output thereby providing an oscilloscope preamplifier with multiple channels, and a second operating mode in which one input is multiplexed to at least a plurality of said interleaved outputs to provide a system with an increased sample rate.

13. An oscilloscope preamplifier as in claim 12 wherein said programmable cross point multiplexing means comprises means for providing a range of operating modes between a maximum channel count mode in which each of a said amplifier inputs is connected to a different single corresponding output and a maximum sample rate mode in which one input is connected to all of said outputs.

14. An oscilloscope preamplifier as in claim 12 wherein said programmable cross-point multiplexing means comprises a plurality of amplifiers, each of said amplifiers connected between one of said plurality of inputs and one of said plurality of outputs.

15. An oscilloscope preamplifier as in claim 14 further including selection means for selecting one or more of said amplifiers, and wherein said programmable cross-point multiplexing means further includes a current source, and switch means, responsive to said selection means, for connecting said selected amplifiers to said current source.

16. An oscilloscope preamplifier as in claim 12 wherein said cross-point multiplexing means comprises:

a plurality of amplifier switching portions, each including a switch means for activating and deactivating said amplifier switching portion;

a plurality of amplifier feedback portions; and wherein there are N×Z of said amplifier switching portions and Z of said amplifier feedback portions, where N is the number of said inputs and Z is the number of said outputs, and wherein there is a different one of said amplifier switching portions connected between each of said inputs and each of said outputs; and each of said amplifier feedback portions is common to a plurality of amplifier switching portions and is connected to its corresponding output.

17. An instrumentation preamplifier system comprising:

preamplifier input and preamplifier output;

an attenuation selector for selecting one of a plurality of attenuations for analog signals passing from said preamplifier input to said preamplifier output and providing electrical data signals representative of said selected attenuation;

a programmable multiplexer having a plurality of multiplexer inputs and at least one multiplexer output, said multiplexer output connected to said preamplifier output;

a plurality of attenuation circuits, each providing a different attenuation and each connected between said preamplifier input and one of said plurality of multiplexer inputs said programmable multiplex connected to said attenuation selector and responsive to said electrical data signals, for connecting one or more of said multiplexer inputs to said multiplexer output to provide said selected attenuation to said analog signals.

18. An instrumentation amplifier as in claim 17 wherein at least one of said plurality of attenuation circuits comprises a voltage divider.

19. An instrumentation amplifier as in claim 17 wherein said preamplifier input is one of a plurality of preamplifier inputs, said preamplifier output is one of a plurality of preamplifier outputs, said attenuation selector includes means for selecting one or more of said plurality of inputs and one or more of said plurality of outputs: and said programmable multiplexer is connected to said plurality of preamplifier inputs and said plurality of preamplifier outputs and is responsive to said attenuation selector for electrically connecting said selected inputs to said selected outputs.

20. An instrumentation amplifier as in claim 17 and further including a multiple gain means, responsive to said attenuation selector for providing one of a plurality of gains to signals passing through said amplifier, whereby the net attenuation of said amplifier comprises the gain provided by said multiple gain means times the attenuation provided by said attenuation circuits.

* * * * *